US009962738B2

(12) United States Patent
Gerlach (10) Patent No.: US 9,962,738 B2
(45) Date of Patent: May 8, 2018

(54) ULTRASONIC TRANSDUCER SYSTEM AND MOTOR VEHICLE INCLUDING AN ULTRASONIC SYSTEM (71) Applicant: Robert Bosch GmbH, Stuttgart (DE)

(72) Inventor: Andre Gerlach, Leonberg-Hoefingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 254 days.

(21) Appl. No.: 14/899,733

(22) PCT Filed: Apr. 3, 2014

(86) PCT No.: PCT/EP2014/056652
§ 371 (c)(1),
(2) Date: Dec. 18, 2015

(87) PCT Pub. No.: WO2014/202249
PCT Pub. Date: Dec. 24, 2014

(65) Prior Publication Data
US 2016/0136688 A1 May 19, 2016

(30) Foreign Application Priority Data

Jun. 20, 2013 (DE) ......................... 10 2013 211 599

(51) Int. Cl.
*B06B 1/06* (2006.01)
*B06B 3/00* (2006.01)
(Continued)

(52) U.S. Cl.
CPC .............. *B06B 1/0644* (2013.01); *B06B 1/06* (2013.01); *B06B 3/00* (2013.01); *G10K 11/004* (2013.01); *G10K 11/18* (2013.01); *H01L 41/25* (2013.01)

(58) Field of Classification Search
CPC .......... B06B 1/06; B06B 1/0644; B06B 3/00; G10K 11/18; G10K 11/004; H01L 41/25
(Continued)

(56) References Cited

U.S. PATENT DOCUMENTS 5,509,417 A 4/1996 Dias et al.
6,198,207 B1 * 3/2001 Lally ................... G01P 15/0915
310/340
(Continued)

FOREIGN PATENT DOCUMENTS

CN 102331574 A 1/2012
CN 103424181 A 12/2013
(Continued)

Primary Examiner — Isam A Alsomiri
Assistant Examiner — Amie M Ndure
(74) Attorney, Agent, or Firm — Norton Rose Fulbright US LLP; Gerard Messina (57) ABSTRACT An ultrasonic transducer system includes at least one transducer element, a diaphragm, and at least one resonance body, the ultrasonic transducer system being configured for transmitting and/or receiving ultrasonic signals, the resonance body being coupled at an end face to the diaphragm and the at least one transducer element being coupled to a lateral surface of the resonance body so that the at least one transducer element and the resonance body have a shared interface. Also described is a method for the manufacture and to a motor vehicle having an ultrasonic transducer system of this type, the diaphragm of the ultrasonic transducer system being formed by an outer skin of a bumper, a side mirror, or a door section, and the transducer element(s) and resonance bodies being situated concealed behind the outer skin.

14 Claims, 8 Drawing Sheets (51) Int. Cl.
*G10K 11/00* (2006.01)
*G10K 11/18* (2006.01)
*H01L 41/25* (2013.01)

(58) Field of Classification Search
USPC .............................. 367/140; 29/594; 310/334
See application file for complete search history.

(56) References Cited

U.S. PATENT DOCUMENTS

| | | |
|---|---|---|
| 2006/0001334 A1 | 1/2006 | Shiba |
| 2007/0035208 A1 | 2/2007 | Tessien et al. |
| 2007/0062292 A1 | 3/2007 | Sato et al. |
| 2008/0037808 A1 | 2/2008 | Sawada et al. |
| 2008/0125658 A1* | 5/2008 | Lee .......................... A61B 8/12 600/459 |
| 2010/0020646 A1 | 1/2010 | Massa |
| 2010/0020990 A1* | 1/2010 | Moon ....................... B06B 3/00 381/161 |
| 2010/0208553 A1* | 8/2010 | Massa .................... G01F 1/662 367/93 |

FOREIGN PATENT DOCUMENTS

| | | | | |
|---|---|---|---|---|
| DE | 10 2008 038 336 | | 2/2009 | |
| DE | 10 2010 063 001 | | 6/2012 | |
| GB | 2 235 820 | | 3/1991 | |
| GB | 2 486 560 | | 6/2012 | |
| GB | 2486560 A | * | 6/2012 | ............. G01S 7/521 |
| JP | 2000 069592 | | 3/2000 | |
| JP | 2000069592 A | * | 3/2000 | |

* cited by examiner

ULTRASONIC TRANSDUCER SYSTEM AND MOTOR VEHICLE INCLUDING AN ULTRASONIC SYSTEM

FIELD OF THE INVENTION

The present invention relates to an ultrasonic transducer system which is configured for transmitting and/or receiving ultrasonic signals, and which includes at least one transducer element and a resonance body. The present invention additionally relates to a method for manufacturing an ultrasonic transducer system of this type and a motor vehicle including an ultrasonic transducer system of this type.

BACKGROUND INFORMATION

Transducer systems for ultrasonic-based surroundings-sensing are used in relation to motor vehicles, moving or stationary machines, such as robots, agricultural machines, or construction machines. To achieve high transmitting power and/or reception sensitivity, these are predominantly resonant transducers, which are made up of solid state bodies and one or multiple transducer elements.

An ultrasonic transducer is discussed in US 2010/0208553 A1 which is installed concealed in an automobile bumper and is used for example for parking assistance purposes. The piezo element is configured as a thin ceramic disk which is situated in parallel to an emission plane of the transducer.

SUMMARY OF THE INVENTION

An ultrasonic transducer system according to the present invention includes at least one transducer element, a diaphragm, and at least one resonance body, the resonance body being coupled at an end face to the diaphragm, and the at least one transducer element being coupled to a lateral surface of the resonance body in such a way that the at least one transducer element and the resonance body have a shared interface.

The definition of the transducer element is thereby to be broadly conceived and includes, for example, electrical-acoustic transducers, which function according to electrostatic, magnetostrictive, piezoelectrical effects, or combinations of these effects. Within the scope of the present invention, the transducer element may in particular be a piezoelectric element and the ultrasonic transducer system may be referred to as a piezoelectric ultrasonic transducer system.

The diaphragm of the ultrasonic transducer system is formed, for example, by an outer skin of a bumper, a side mirror, or a door section of a motor vehicle, the transducer element(s) and the resonance body or resonance bodies being situated concealed behind the outer skin. Due to the coupling, the diaphragm forms a resonance diaphragm of the ultrasonic transducer system. In contrast to known transducer elements mounted in a concealed manner, the system according to the present invention represents an alternative in which there exist savings potentials, for example in that thinner transducer elements may be used or less material may be used for the transducer elements.

Advantageous refinements and improvements of the subject matter defined in the independent claim are possible due to the features listed in the dependent claims.

It may be provided that the diaphragm is formed from a thin material layer which is manufactured for example from a polymer material. The diaphragm may have a thickness between 0.1 mm and 5 mm, particularly less than 2 mm or less than 1 mm. The coupling of the resonance body at the end face to the diaphragm may be carried out directly or indirectly, however, in any case in such a way that an acoustic coupling is enabled at a sufficient level, i.e., that suitable oscillations may be transmitted. The coupling may be accomplished, for example, by a press fit or force fit, such as by screwing in, or also by adhesive bonding. The coupling may also be carried out by extrusion coating the resonance body with the material of the outer skin, which may also be referred to as embedding. An indirect coupling may mean that an additional material layer is provided between the resonance body and the diaphragm, for example, a fluid like a gel or an oil. The additional material layer may be provided in particular for the purpose of optimizing the acoustic coupling between the resonance body and the diaphragm, for example to compensate for tolerances in the dimensions of the components or the roughness of the surfaces of the coupling partners.

According to one specific embodiment, the resonance body has a front mass and a rear mass which are manufactured from different materials. The electroacoustic emission emitted by the transducer element for surroundings sensing thus leaves the transducer system in the direction of the end face of the resonance body, therefore rearward emission is suppressed. The rear mass functions as a so-called inertial mass, i.e., due to its inertia, it enables the introduction of force into the front body and thus also functions to attenuate the oscillations with respect to the range in which no emission is desired. According to one specific embodiment, it is provided that the transducer element is coupled circumferentially at a lateral surface of the front mass.

The front mass may be manufactured from a plastic or rubber material and the rear mass from a metal, for example, from aluminum, sheet metal, steel, or brass. The selection of suitable materials may be determined by limitations or specifications with respect to the reception sensitivities or transmission signal strengths to be achieved by the ultrasonic transducer system. In particular, however, additional surrounding influences, such as the ambient temperature or, for example, the mechanical load due to shaking, may also be considered in order to determine suitable materials.

According to one specific embodiment, the resonance body has a shape tapering toward the end face. A taper of this type may, for example, be formed by one or multiple shoulders, i.e., a step-wise reduction of the cross section of the resonance body, or also by a continuous reduction of the cross section of the resonance body.

The resonance body and/or the transducer element may have a ring-shaped design. It is possible that the resonance body is a solid body, for example a cylindrical body, which is accommodated in a ring-shaped transducer element or that the transducer element is a solid body, for example a cylindrical body, which is accommodated in a ring-shaped or pot-shaped resonance body. It may alternatively be provided that the resonance body and also the transducer element have a ring-shaped design; one ring may be fitted into the other so that the resonance body surrounds the transducer element or so that the transducer element surrounds the resonance body. Ring-shaped may mean here in particular that the corresponding body has a through opening so that there is an inner peripheral surface of the body and an outer peripheral surface. The inner and outer peripheral surfaces are thereby referred to as lateral surfaces. A coupling to a lateral surface of the resonance body may be referred to as a coupling to the inner peripheral surface as well as a coupling to the outer peripheral surface.

Depending on the specific embodiment, the resonance body has a round, triangular, quadrangular, rectangular, or polygonal cross section. Polygonal may mean a pentagonal, hexagonal, or octagonal cross section, a regular structure, for example equally-long segments of a polygonal line approximating a circular area, which may be a particular embodiment. The cross sections may be determined by limitations or specifications with respect to the sensitivities to be achieved in the ultrasonic transducer system as well as by surrounding influences like, for example, vibration resistance or a temperature resistance, the objective of performance optimization having priority.

According to one specific embodiment, the transducer element and the resonance body are coupled to one another by a press fit or by adhesive bonding. The selection of the coupling may be determined by the anticipated application area, for example by specifications of vibration resistance of the system.

According to one specific embodiment, the ultrasonic transducer system has exactly one transducer element which is fully circumferentially coupled to the lateral surface. It may alternatively be provided that the ultrasonic transducer system has multiple transducer elements which are each partially circumferentially coupled to the lateral surface.

The present invention may be used in particular in surroundings sensors of the type which are provided, for example, in front and/or rear bumpers of the vehicle for the purpose of parking assistance and/or collision avoidance. Ultrasonic signals are thereby conventionally transmitted by a medium like air or water from an emitter to a receiver, or are transmitted from an emitter into the surroundings, or ultrasonic signals reflecting from an object located in the surroundings are detected, and the transit time and/or transit time differences and/or additional variables, for example amplitudes and phases of the ultrasonic signals, are measured. Typically, ultrasonic transducers are thereby used which may emit ultrasonic waves as well as receive ultrasonic waves. However, it may also be provided that the ultrasonic transducers are used only as receivers or only as transmitters.

In particular, the ultrasonic transducer system may be installed in an ultrasonic system which includes a group of ultrasonic sensors, at least one, which may have all, ultrasonic sensors including the features of the ultrasonic transducer system. The ultrasonic system may be configured, for example, for the purpose of detecting partial surroundings of the motor vehicle. For example, the ultrasonic sensors in the front area for detecting the surroundings ahead of the vehicle and/or the ultrasonic sensors in the side areas for detecting a side area of the vehicle and/or the ultrasonic sensors in the rear end for detecting rearward surroundings of the vehicle are each assigned to an ultrasonic system of this type. Typically, four to six sensors are hereby installed in a bumper, only a maximum of four sensors being mounted with approximately the same line of sight. In order to also particularly detect the surroundings next to the vehicle, additional sensors are positioned in the front bumper in such a way that they have detection areas to the left and to the right. Additionally or alternatively, sensors may also be positioned in the rear bumper in such a way that these detect an area to the left and right next to the motor vehicle. The ultrasonic system additionally also has a control device and a signal processing unit assigned to the respective group. To detect the side area of the vehicle, ultrasonic sensors installed laterally in the front and rear bumpers may be used as well as sensors of this type which are installed in a side mirror or in a door section.

The present invention provides an ultrasonic transducer which is additionally suited for a use for the flow measurement of fluid media, in particular in the intake manifold and/or in the exhaust gas system and/or in the exhaust gas recirculation system and/or downstream from a turbocharger of internal combustion engines in the motor vehicle sector.

A method for manufacturing an ultrasonic transducer system which is configured for transmitting and/or receiving ultrasonic signals, in particular one of the previously described ultrasonic transducer systems, includes the following steps:

a) manufacturing a device including a transducer element and a resonance body, the at least one transducer element being coupled to a lateral surface of the resonance body in such a way that the at least one transducer element and the resonance body have a shared interface, b) fastening the device to a diaphragm which is formed by an outer skin of a component, the resonance body being coupled at an end face to the diaphragm.

According to an additional aspect of the present invention, a motor vehicle has a bumper, a side mirror, or a door section and a previously described ultrasonic transducer system, the diaphragm of the ultrasonic transducer system being formed by an outer skin of the bumper, the side mirror, or the door section, and the transducer element(s) and the resonance body or resonance bodies being situated concealed behind the outer skin.

If the thickness of the outer skin of the bumper or the side mirror or the door section, in which the ultrasonic transducer system is installed, does not correspond to the thicknesses listed above for acoustic transmission, it may be provided that the bumper, the side mirror, or the door section of the vehicle, in which the ultrasonic transducer system is to be installed, is configured to be correspondingly thinner than otherwise. Local attenuations of this type may be incorporated by subsequent machining, for example, by milling, or already in the manufacturing process, for example during injection molding.

Exemplary embodiments of the present invention are shown in the drawings and are explained in greater detail in the subsequent description.

DETAILED DESCRIPTION

Figure 1A:
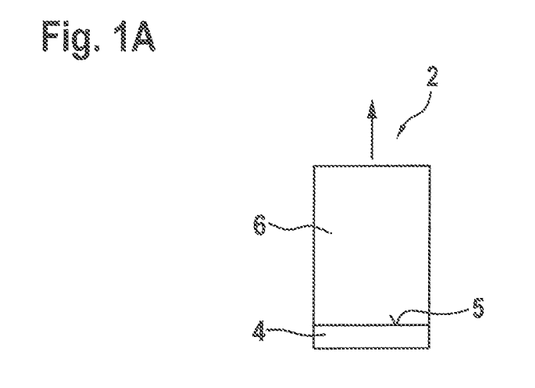
FIGS. 1A and 1B show ultrasonic transducers according to the related art.
Figure 1B:
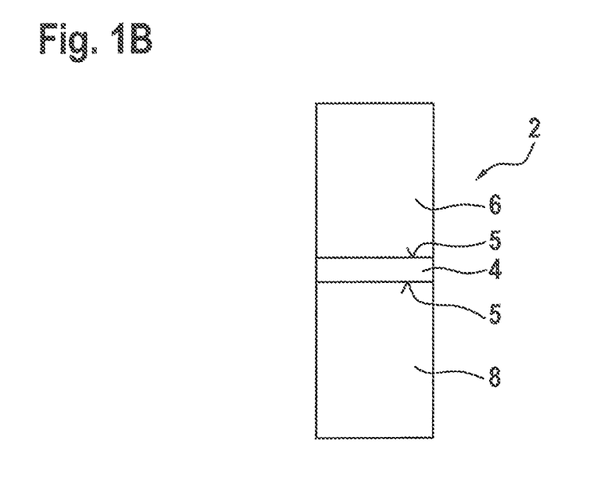

FIG. 1A shows an ultrasonic transducer 2 including a transducer element 4 which is formed as a flat disk and whose main surface 5 abuts on a thick resonance body 6. FIG. 1B shows an additional ultrasonic transducer 2 in which a flat transducer element 4 is adjacently situated between a thick resonance body 6 and a thick rear mass 8 with their main surfaces 5. The ultrasonic transducers shown in FIG. 1A and FIG. 1B are also referred to as so-called thickness oscillators.

Figure 2A:
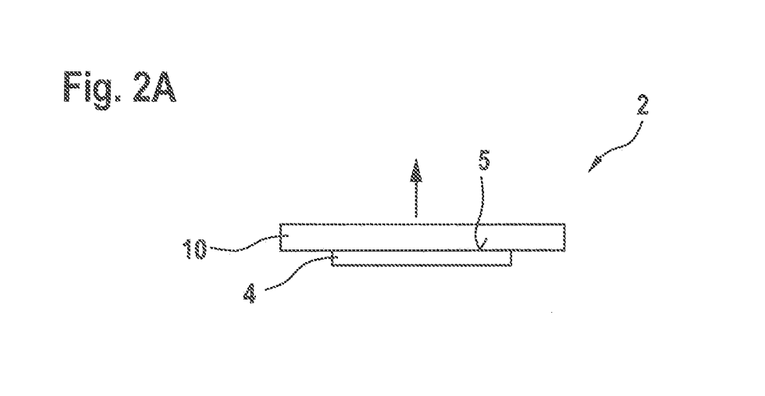
FIGS. 2A, 2B and 2C show ultrasonic transducers according to the related art.
Figure 2B:
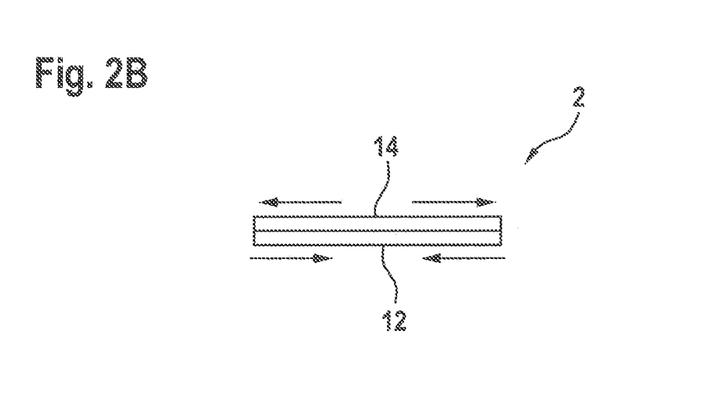
Figure 2C:
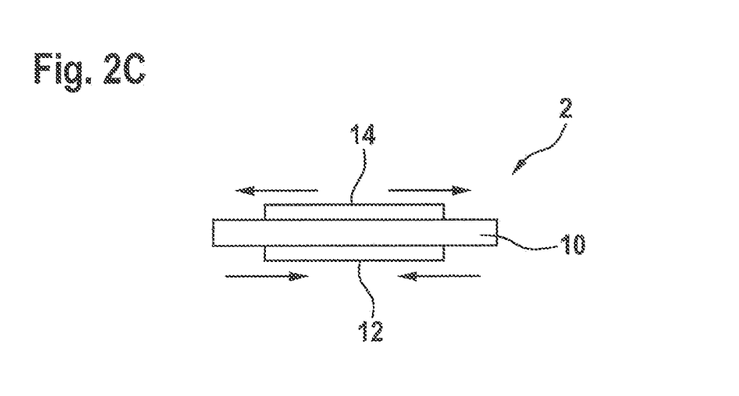

FIG. 2A through FIG. 2C show ultrasonic transducers 2 which are referred to as bending oscillators. The emission direction of ultrasonic transducer 2 is indicated in FIG. 2A by an arrow; the emission direction of ultrasonic transducer 2 shown in FIG. 2B and FIG. 2C is equivalent. Ultrasonic transducer 2 from FIG. 2A includes a flat transducer element 4 which abuts with its main surface 5 against a flat resonance body 10. An ultrasonic transducer 2 is shown in FIG. 2B which is implemented by two transducer elements 12, 14 abutting against one another, these being contacted in opposition. For example, while first transducer element 12 is constricted with a first electrical signal, second transducer element 14 expands so that a spatial oscillation amplitude is produced. Another specific embodiment of a bending oscillator is ultrasonic transducer 2 shown in FIG. 2C in which two transducer elements 12, 14 are contacted and situated in parallel to one another, a flat resonance body 10 being situated between transducer elements 12, 14 in order to amplify the acoustic oscillations.

Figure 3A:
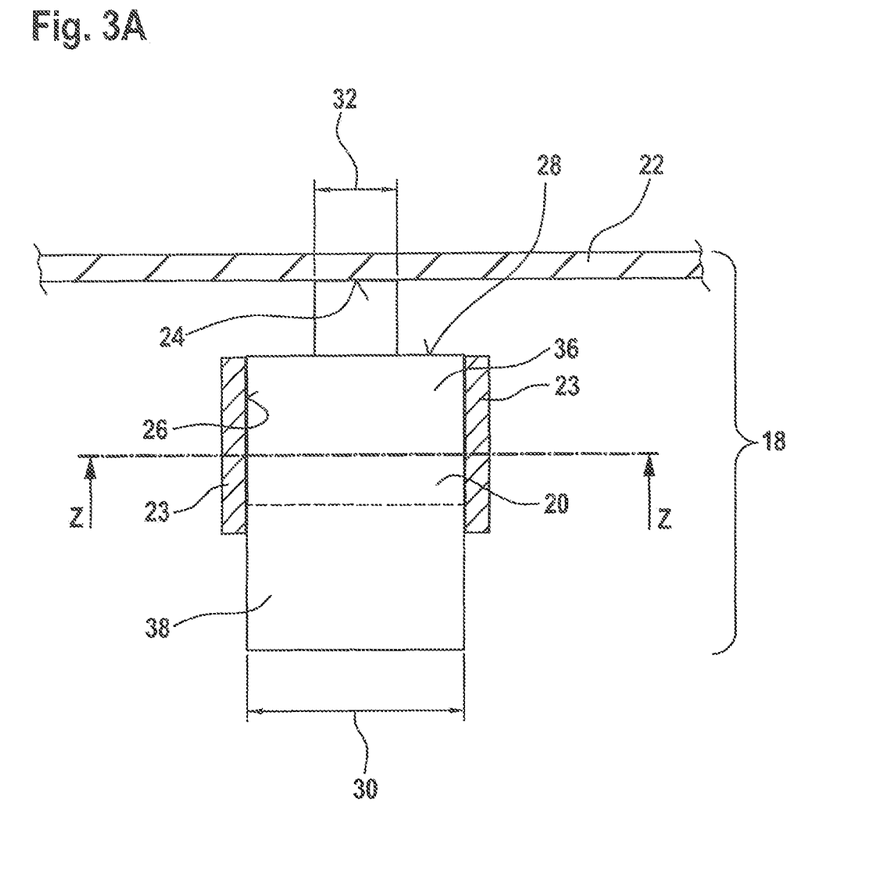
FIGS. 3A and 3B show ultrasonic transducer systems according to the present invention.

FIG. 3A shows an ultrasonic transducer system 18 according to a first specific embodiment of the present invention in a side sectional view. Ultrasonic transducer system 18 includes a transducer element 23, a diaphragm 22, and a resonance body 20. Resonance body 20 is coupled to diaphragm 22 via an end face 24, i.e., in the specific embodiment shown, end face 24 forms an interface to diaphragm 22. The coupling between resonance body 20 and diaphragm 22 may be carried out directly or indirectly; an indirect contact means that at least one layer of an additional material, for example a fluid layer like an oil or gel, is situated between end face 24 of resonance body 20 and diaphragm 22 in order to improve the acoustic coupling. A mechanical coupling may be present between end face 24 of resonance body 20 and diaphragm 22, for example via a screw joint or a clamping joint of resonance body 20 in diaphragm 22, a suitable arrangement for this purpose not being shown in FIG. 3A. It may likewise be provided that resonance body 20 is glued to diaphragm 22. It may be provided that diaphragm 22 is configured to be thinner in a contact area 32 than outside of contact area 32 so that resonance body 20 is at least partially countersunk in the diaphragm in contact area 32. This has the advantage that ultrasonic transducer system 18 may be configured on the one hand to be sufficiently sensitive for receiving ultrasonic waves or may emit sufficiently strong ultrasonic waves and on the other hand diaphragm 22 may be configured to be sufficiently thick outside of contact area 32.

Transducer element 23 is situated on a lateral surface 26 of the resonance body in such a way that these have a shared interface with one another. Lateral surface 26 extends approximately perpendicularly to end face 24 in the exemplary embodiment shown. A diameter 30 of the cross section of resonance body 20 on the level of transducer element 23 is greater than contact area 32 which corresponds to a diameter of the cross section of end face 24 of resonance body 20. Resonance body 20 thus has a shape tapering toward end face 32. The taper is formed in the exemplary embodiment shown in FIG. 3A by a shoulder 28, i.e., it includes a step-wise reduction of the cross section of resonance body 20.

Resonance body 20 includes in the exemplary embodiment shown a front mass 36 and a rear mass 38 which may be made from different materials. Likewise, more than two material layers may be present; these may be surrounded partially or completely by transducer element 23. In the exemplary embodiment shown, front mass 36 may be completely surrounded by transducer element 23 and rear mass 38 only partially.

Figure 3B:
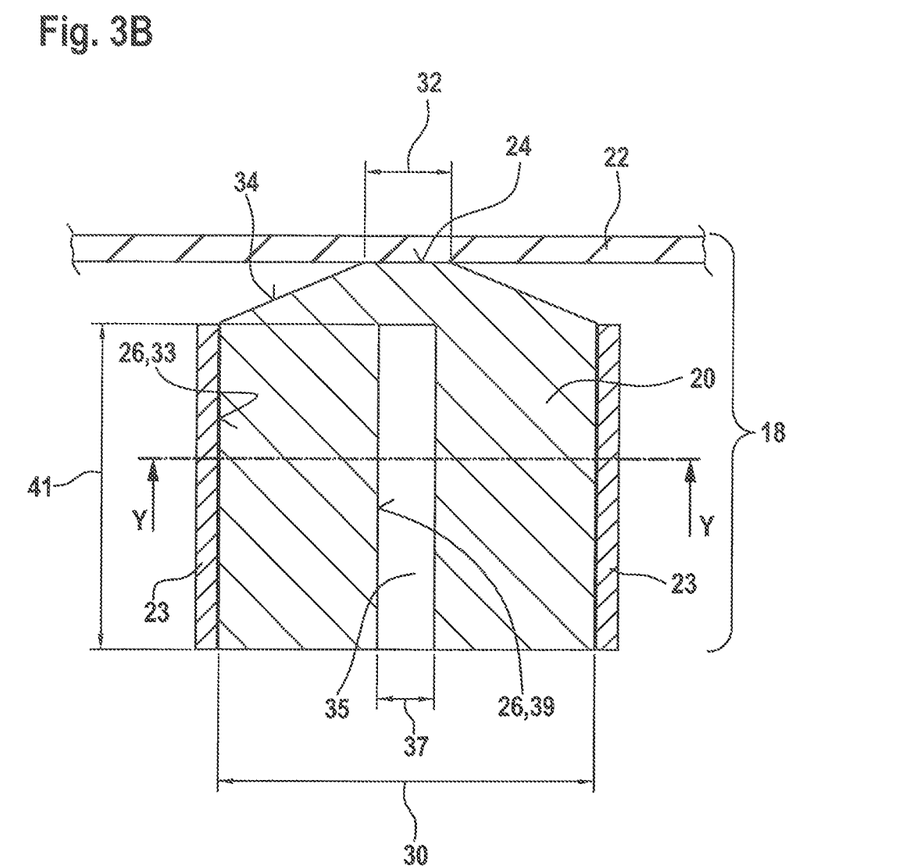

FIG. 3B shows an ultrasonic transducer system 18 according to an additional specific embodiment of the present invention. Ultrasonic transducer system 18 also includes a resonance body 20 which contacts a diaphragm 22 at an end face 24. Contact area 32, which coincides with the diameter of the cross section of end face 24 of resonance body 20, is smaller than diameter 30 of the cross section of resonance body 20 on the level where transducer element 23 circumferentially contacts resonance body 20 at a lateral surface 26. The taper results in the exemplary embodiment shown due to a consistent reduction of the cross section, and in the exemplary embodiment shown due to a conic section 34 of resonance body 20.

Resonance body 20 has a ring-shaped design on the level of transducer element 23. A radially symmetrical recess 35 having a diameter 37 is located centrally. An inner peripheral surface 39, which is a peripheral surface of the recess, and also an outer peripheral surface 33 of the resonance body, are referred to as lateral surface 26. Diameter 37 of recess 35 is selected as smaller in the exemplary embodiment shown than the diameter of the cross section of end face 24 which forms contact area 32; however, it may also be larger than the latter. The recess has a height 41 which here, for example, corresponds to the size of transducer element 23.

Figure 4A:
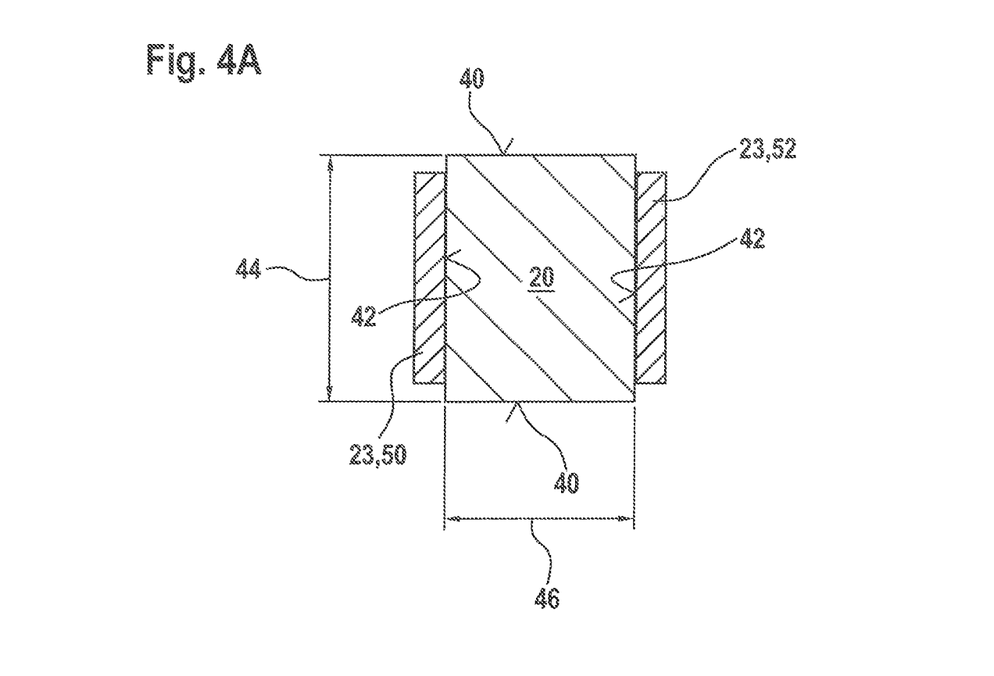
FIGS. 4A, 4B, 4C and 4D show cross sections through ultrasonic transducer systems according to the present invention according to different specific embodiments.

FIG. 4A shows a possible cross section through ultrasonic transducer system 18 in FIG. 3A along line z-z. In the specific embodiment shown, resonance body 20 has a rectangular cross section with a cross-sectional depth 44 and a cross-sectional width 46 assignable to the cross section. Transducer element 23 includes here a first transducer element 50 and a second transducer element 52 which partially circumferentially contact resonance body 20 at two diametrically opposed peripheral surface sections 42. Resonance body 20 of the rectangular cross section thus has two non-covered peripheral surface sections 40 and two covered peripheral surface sections 42.

Figure 4B:
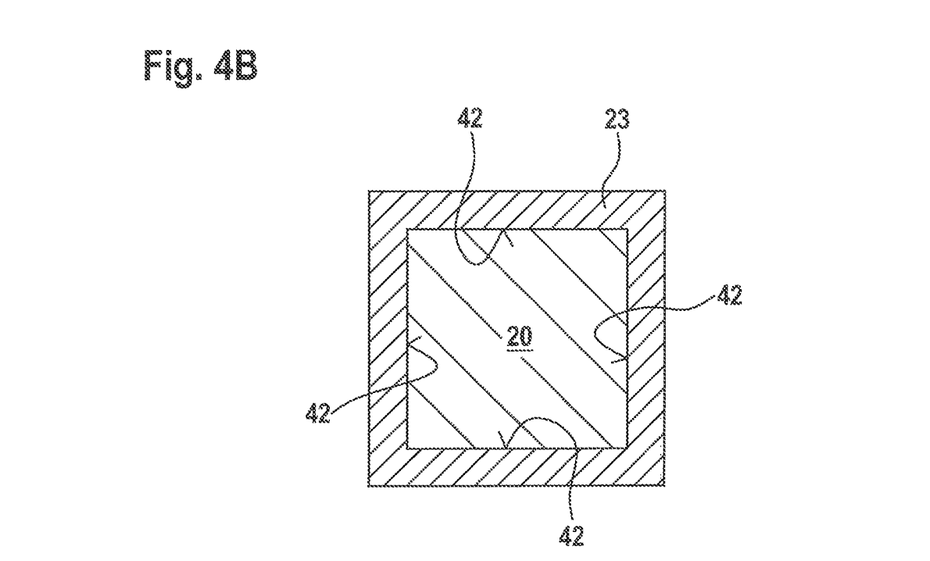

FIG. 4B shows an alternative specific embodiment of ultrasonic transducer system 18 from FIG. 3A. In this exemplary embodiment, transducer element 23 is configured as one piece and surrounds resonance body 20 fully circumferentially, which is configured having a rectangular cross section. Resonance body 20 thus has only covered peripheral surface sections 42.

Figure 4C:
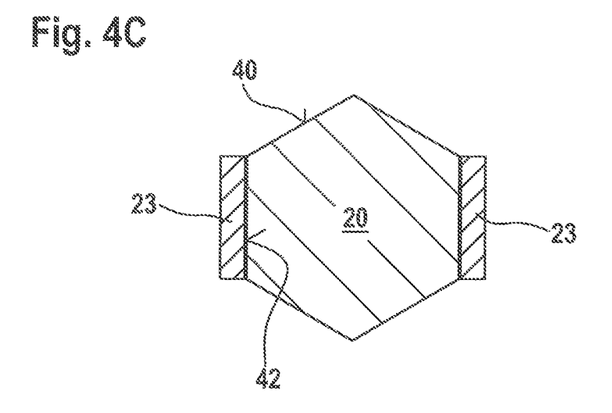

FIG. 4C shows an additional specific embodiment of ultrasonic transducer system 18 shown in FIG. 3A, in which resonance body 20 has a hexagonal cross section. Two transducer elements 23 are shown which cover two peripheral surface sections 42 which are situated diametrically opposite to one another. Alternatively, three transducer elements 23 may also be provided.

Figure 4D:
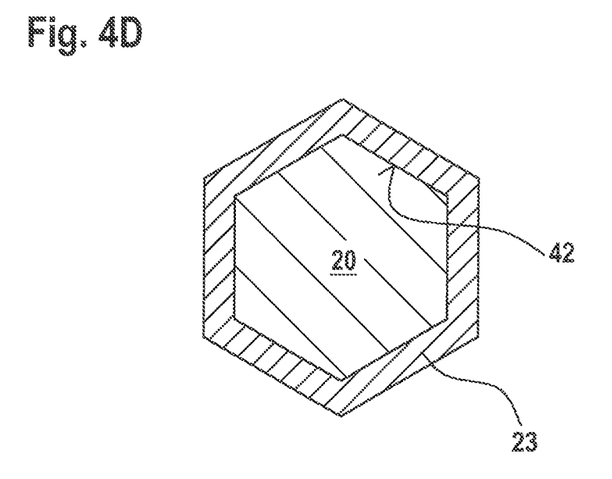

FIG. 4D shows an additional specific embodiment of an ultrasonic transducer system 18 from FIG. 3A, a hexagonal cross section of resonance body 20 being shown with a transducer element 23 coupled fully circumferentially.

Additional specific embodiments are possible, in which resonance body 20 may have a polygonal cross section and one or multiple transducer elements 23 may be provided, which are each coupled partially circumferentially to lateral surface 26 of the resonance body or are coupled fully circumferentially to lateral surface 26 of the resonance body.

Figure 5A:
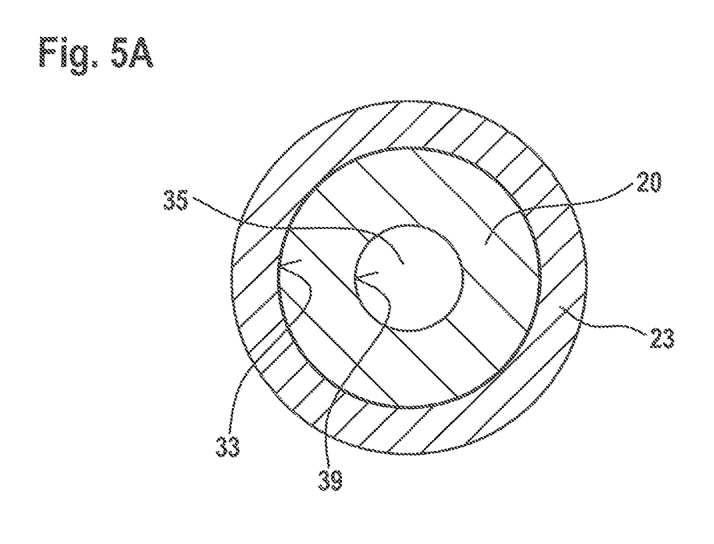
FIGS. 5A, 5B, 5C and 5D show cross sections through ultrasonic transducer systems according to the present invention according to additional specific embodiments.

FIG. 5A shows a cross-sectional view of the exemplary embodiment shown in FIG. 3B of ultrasonic transducer system 18 along line y-y. In this exemplary embodiment, resonance body 20 has a circular cross section with a centrally situated recess 35. Transducer element 23 is situated fully circumferentially on an outer peripheral surface 33 of resonance body 20 and has therefore a ring-shaped design.

Figure 5B:
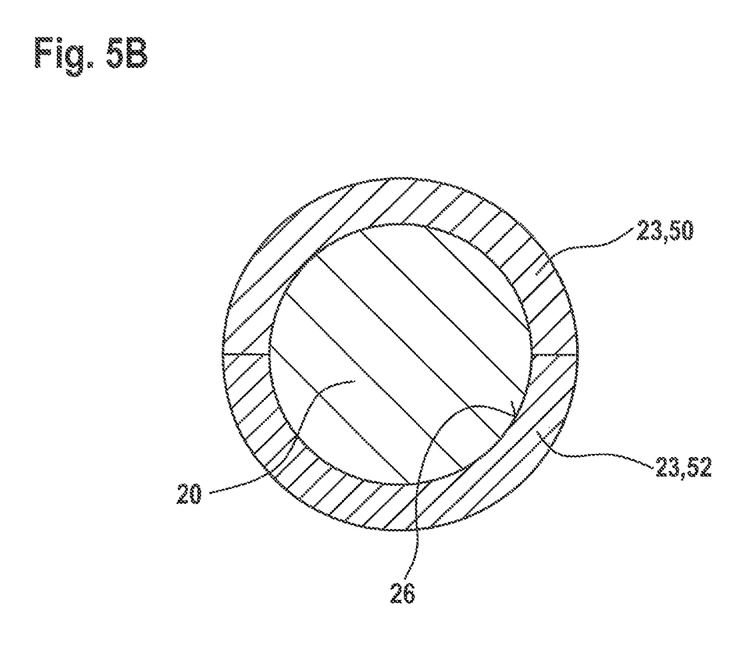

FIG. 5B shows an additional specific embodiment of ultrasonic transducer system 18 which is shown in FIG. 3A. Resonance body 20 has a circular cross section without a recess, i.e., is configured as a cylinder. In addition, a transducer element 23 is shown which has a first transducer element 50 and a second transducer element 52 which surround resonance body 20 fully circumferentially along lateral surface 26.

Figure 5C:
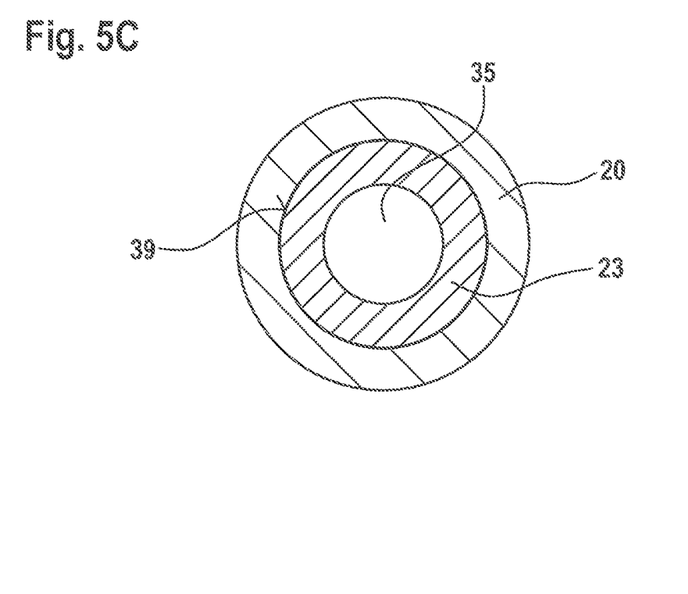

FIG. 5C shows an additional specific embodiment of an ultrasonic transducer system 18. According to this specific embodiment, resonance body 20 has a ring-shaped design, as is described for example with reference to FIG. 3B, and transducer element 23 has ring-shaped design, as is described for example with reference to FIG. 5A or FIG. 5B. In this case, transducer element 23 is situated in recess 35 of resonance body 20 and contacts the latter on its inner peripheral surface 39, which is a peripheral surface of recess 35. It is possible that transducer element 23 is not ring-shaped as shown, but instead forms a cylindrical solid body.

Figure 5D:
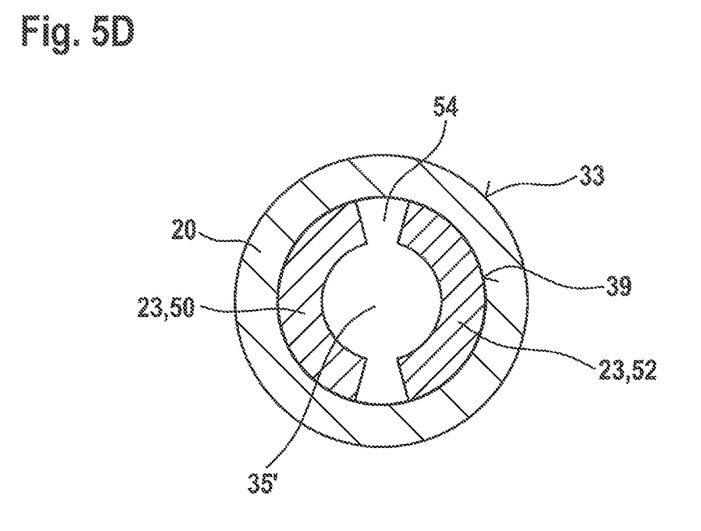

FIG. 5D shows an additional possible specific embodiment including a resonance body 20 having a ring-shaped diameter on the level of transducer element 23, transducer element 23 being situated in a recess 35' and coupled partially circumferentially to resonance body 20, more exactly to inner peripheral surface 39 of lateral surface 26 of resonance body 20. Transducer element 23 includes a first transducer element 50 and a second transducer element 52 which are spaced at a distance from one another by a clearance 54. Of course, it is possible that more than two transducer elements 23 are situated in such a way.

The present invention is not limited to the exemplary embodiments described here and the aspects highlighted therein. Rather, within the range indicated by the claims, a plurality of variations is possible which lie within the scope of those skilled in the art.

What is claimed is:

1. An ultrasonic transducer system, comprising:
   an ultrasonic transducer arrangement, including at least one transducer element, a diaphragm, and at least one resonance body;
   wherein:
      the ultrasonic transducer arrangement is configured to at least one of transmit and receive ultrasonic signals;
      the resonance body is coupled at an end face of the resonance body to the diaphragm;
      the at least one transducer element is coupled to a lateral surface of the resonance body so that the at least one transducer element and the resonance body have a shared interface; and
      at least one of:
         the resonance body tapers inwardly with a slope that gradually narrows from a first width distal from the end face to a second width at the end face;
         at least one of the resonance body and the at least one transducer element is cylindrical about a longitudinal axis with a bore that extends parallel to the longitudinal axis through at least a part of the at least one of the resonance body and the at least one transducer element;
         the at least one transducer element is formed as a single transducer element that is fully circumferentially coupled to the lateral surface; and
         the at least one transducer element is formed as a plurality of transducer elements that are each partly circumferentially coupled to the lateral surface.

2. The ultrasonic transducer system of claim 1, wherein the diaphragm has a thickness between 0.1 mm and 5 mm.

3. The ultrasonic transducer system of claim 1, wherein the resonance body has a front mass and a rear mass which are manufactured from different materials.

4. The ultrasonic transducer system of claim 1, wherein the resonance body tapers inwardly with the slope that gradually narrows from the first width distal from the end face to the second width at the end face.

5. The ultrasonic transducer system of claim 1, wherein the at least one of the resonance body and the at least one transducer element is cylindrical about the longitudinal axis with the bore that extends parallel to the longitudinal axis through the at least the part of the at least one of the resonance body and the at least one transducer element.

6. The ultrasonic transducer system of claim 1, wherein the transducer element and the resonance body are coupled to one another by a press fit or by adhesive bonding.

7. The ultrasonic transducer system of claim 1, wherein the at least one transducer element is formed as the single transducer element that is fully circumferentially coupled to the lateral surface.

8. The ultrasonic transducer system of claim 1, wherein the at least one transducer element is formed as the plurality of transducer elements that are each partly circumferentially coupled to the lateral surface.

9. A method for manufacturing an ultrasonic transducer system, which is configured for at least one of transmitting and receiving ultrasonic signals, the method comprising:
   manufacturing a device including a transducer element and a resonance body, the at least one transducer element being coupled to a lateral surface of the resonance body so that the at least one transducer element and the resonance body have a shared interface; and
   fastening the device to a diaphragm which is formed by an outer skin of a component, the resonance body being coupled at an end face to the diaphragm;
   wherein at least one of:
      the resonance body tapers inwardly with a slope that gradually narrows from a first width distal from the end face to a second width at the end face;
      at least one of the resonance body and the at least one transducer element is cylindrical about a longitudinal axis with a bore that extends parallel to the longitudinal axis through at least a part of the at least one of the resonance body and the at least one transducer element;
      the at least one transducer element is formed as a single transducer element that is fully circumferentially coupled to the lateral surface; and
      the at least one transducer element is formed as a plurality of transducer elements that are each partly circumferentially coupled to the lateral surface.

10. A motor vehicle, comprising:
    one of a bumper, a side mirror, and a door section;
    an ultrasonic transducer system:
    wherein:

the ultrasonic transducer system includes an ultrasonic transducer arrangement that includes at least one transducer element, a diaphragm, and at least one resonance body;

the ultrasonic transducer arrangement is configured to at least one of transmit and or receive ultrasonic signals;

the resonance body is coupled at an end face of the resonance body to the diaphragm;

the at least one transducer element is coupled to a lateral surface of the resonance body so that the at least one transducer element and the resonance body have a shared interface;

the diaphragm is formed by an outer skin of the one of the bumper, the side mirror, and the door section;

the at least one transducer element and the resonance body are situated in a concealed manner behind the outer skin; and at least one of:
- the resonance body tapers inwardly with a slope that gradually narrows from a first width distal from the end face to a second width at the end face;
- at least one of the resonance body and the at least one transducer element is cylindrical about a longitudinal axis with a bore that extends parallel to the longitudinal axis through at least a part of the at least one of the resonance body and the at least one transducer element;
- the at least one transducer element is formed as a single transducer element that is fully circumferentially coupled to the lateral surface; and
- the at least one transducer element is formed as a plurality of transducer elements that are each partly circumferentially coupled to the lateral surface.

11. The ultrasonic transducer system of claim 5, wherein the resonance body is cylindrical about the longitudinal axis with the bore that extends parallel to the longitudinal axis through at least a part of the resonance body and the at least one transducer element is housed within the bore of the resonance body.

12. The ultrasonic transducer of claim 11, wherein at least one transducer is also cylindrically formed with a bore extending longitudinally there-through.

13. The ultrasonic transducer of claim 5, wherein the resonance body is cylindrical about the longitudinal axis with the bore that extends parallel to the longitudinal axis, and the bore does not extend completely through to the end face of the resonance body.

14. The ultrasonic transducer of claim 13, wherein a width of the resonance body distal from the end face is narrower than a width of the resonance body at the end face, and the bore extends longitudinally within a section of the resonance body where the resonance body is widest until a point at which the resonance body begins to narrow.

\* \* \* \* \*